United States Patent
Kretschmann et al.

(10) Patent No.: US 9,396,864 B2
(45) Date of Patent: Jul. 19, 2016

(54) ENERGY SUPPLY DEVICE FOR EXPLOSION-PROOF ELECTRONIC FUNCTIONAL UNITS

(71) Applicant: ABB TECHNOLOGY AG, Zürich (CH)

(72) Inventors: Rainer Kretschmann, Bad Oeynhausen (DE); Ralf Schäffer, Hille (DE); Thomas Keul, Freigericht (DE)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 14/503,836

(22) Filed: Oct. 1, 2014

(65) Prior Publication Data

US 2015/0092321 A1    Apr. 2, 2015

(30) Foreign Application Priority Data

Oct. 1, 2013 (DE) ..................... 20 2013 008 747 U

(51) Int. Cl.
*H01F 27/26* (2006.01)
*H05K 1/18* (2006.01)
(Continued)

(52) U.S. Cl.
CPC .......... *H01F 27/266* (2013.01); *H01F 27/2804* (2013.01); *H01F 27/306* (2013.01); *H02J 3/00* (2013.01); *H05K 1/0271* (2013.01);
(Continued)

(58) Field of Classification Search
CPC ........... G05F 7/00; H01F 27/08; H01F 27/24; H01F 27/28; H01F 27/2804; H01F 27/2809; H01R 12/61; H02J 5/00; H05K 1/02; H05K 1/05; H05K 1/18

USPC ......... 361/600, 622, 627, 761, 763, 764, 765, 361/780, 794, 798, 826; 174/250, 257, 259, 174/261, 149 B, 532; 336/147, 192, 200, 336/222, 223, 232; 307/11, 104; 29/831, 29/839

See application file for complete search history.

(56) References Cited

U.S. PATENT DOCUMENTS 4,831,278 A    5/1989   Ueda et al.
5,373,112 A * 12/1994   Kamimura .......... H01F 17/0006
                                                                            174/250

(Continued)

FOREIGN PATENT DOCUMENTS

DE    20 2013 08 747 U1    12/2013
EP    1 014 531 A2    6/2000
(Continued)

OTHER PUBLICATIONS

European Search Report issued on Feb. 5, 2015, by the European Patent Office in corresponding European Patent Application No. 14003318.4-1556. (4 pages).

*Primary Examiner* — Michail V Datskovskiy
(74) *Attorney, Agent, or Firm* — Taft Stettinius & Hollister LLP

(57) ABSTRACT

An exemplary energy supply device for explosion-proof electronic functional units supplies each functional unit with a high-frequency AC voltage via an inductor. The inductors are formed as substantially congruent conductor tracks of a multi-level printed circuit board, which can be connected to one another and arranged vertically on a distribution printed circuit board. The number of metallization planes of the multi-level printed circuit board being greater than the number of metallization planes of the distribution printed circuit board.

6 Claims, 1 Drawing Sheet

(51) Int. Cl.
*H05K 1/02* (2006.01)
*H05K 1/05* (2006.01)
*H01F 27/28* (2006.01)
*H01F 27/30* (2006.01)
*H02J 3/00* (2006.01)
*H05K 1/14* (2006.01)
*H05K 1/16* (2006.01)
*H05K 3/36* (2006.01)

(52) U.S. Cl.
CPC .................. *H05K 1/05* (2013.01); *H05K 1/141* (2013.01); *H05K 1/165* (2013.01); *H05K 1/18* (2013.01); *H01F 2027/2809* (2013.01); *H05K 1/0298* (2013.01); *H05K 3/366* (2013.01); *H05K 2201/086* (2013.01); *H05K 2201/1003* (2013.01)

(56) References Cited

U.S. PATENT DOCUMENTS

| | | | |
|---|---|---|---|
| 5,804,959 A | 9/1998 | Nakagawa et al. | |
| 6,244,876 B1 * | 6/2001 | Saka | H02G 5/005 174/59 |
| 6,674,006 B1 * | 1/2004 | Linehan | H01R 31/085 174/149 B |
| 7,557,298 B2 * | 7/2009 | Vanhoutte | H02G 5/005 174/149 B |
| 7,724,498 B2 * | 5/2010 | Mosley | H01G 4/232 257/E27.048 |
| 7,907,043 B2 * | 3/2011 | Mori | H01F 17/0013 336/200 |
| 7,973,635 B2 * | 7/2011 | Baarman | H01F 5/003 336/147 |
| 8,310,329 B1 | 11/2012 | Herbert | |
| 8,456,263 B2 | 6/2013 | Salomäki | |
| 8,587,950 B2 * | 11/2013 | Ewing | G06F 1/189 174/261 |
| 2003/0227764 A1 * | 12/2003 | Korczynski | B60R 16/0238 361/826 |
| 2004/0246689 A1 * | 12/2004 | Espinoza-Ibarra | H05K 1/183 361/761 |
| 2008/0001253 A1 * | 1/2008 | Mosley | H01G 4/232 257/532 |
| 2009/0085706 A1 * | 4/2009 | Baarman | H01F 5/003 336/200 |
| 2011/0168435 A1 * | 7/2011 | Barry | H05K 1/0265 174/257 |
| 2012/0242442 A1 | 9/2012 | Salomäki | |

FOREIGN PATENT DOCUMENTS

| | | |
|---|---|---|
| FR | 2 571 203 A1 | 4/1986 |
| JP | 62-154609 A | 7/1987 |
| WO | 2004/055480 A1 | 7/2004 |
| WO | 2011/042614 A1 | 4/2011 |

* cited by examiner

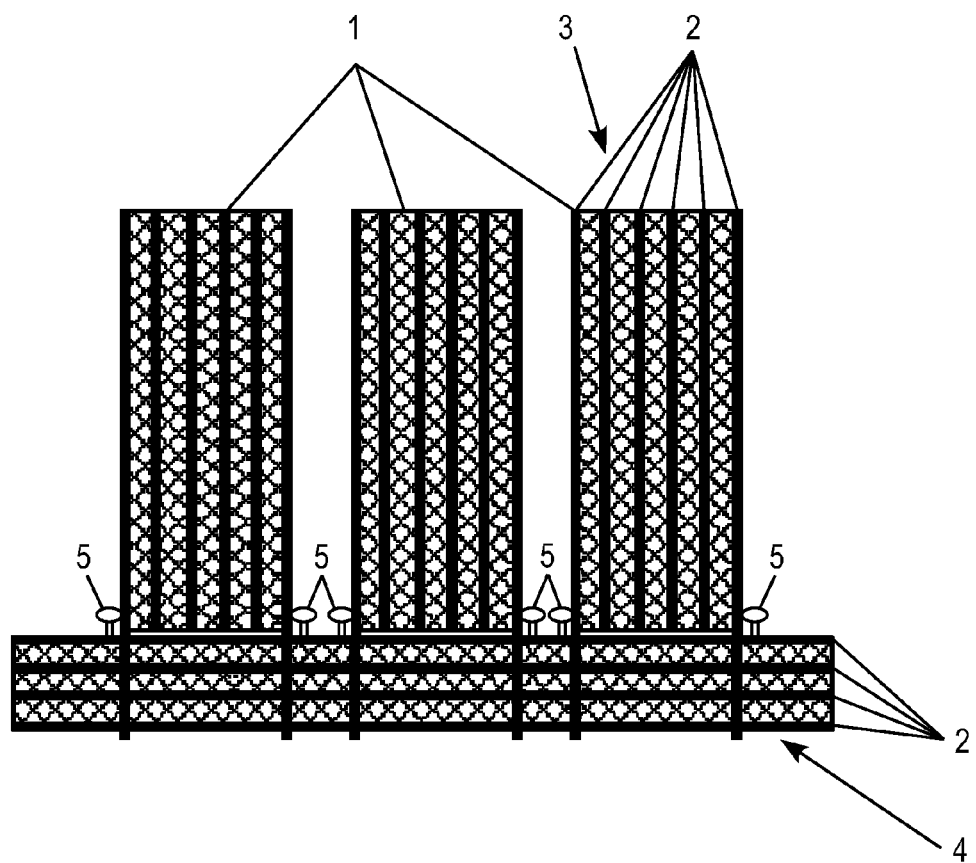

ENERGY SUPPLY DEVICE FOR EXPLOSION-PROOF ELECTRONIC FUNCTIONAL UNITS

RELATED APPLICATION(S)

This application claims priority under 35 U.S.C. §119 to German application DE 202013008747.1 filed in Germany on Oct. 1, 2013, the entire contents of which is hereby incorporated by reference.

FIELD

The disclosure relates to an energy supply device for explosion-proof electronic functional units.

BACKGROUND INFORMATION

Such energy supply devices can be used in automation systems to supply components close to the process and communication devices assigned to said components.

EP 1014531 A2 discloses such an energy supply device in which the functional units can be supplied from a high-frequency AC voltage which is individually output for each of the functional units via an inductor. As described the windings of the inductors are formed as substantially congruent conductor tracks of a multi-level printed circuit board which can be connected to one another, as can be known, in principle, from JP 62154609 A1. In addition, it is proposed to cause the inductance of the inductors by means of ferrite cores which project through openings in the multi-level printed circuit board. When designing the inductor with a ferrite core, additional measures should be taken to prevent the ferrite core from changing its position and/or breaking. An additional air gap or a change in the position of the core changes the inductance of the inductor and, as a result, can have an adverse effect on the explosion protection.

This known arrangement employs several disadvantages. For example, in order to accommodate the ferrite cores, recesses should be made in the multi-level printed circuit board. The production expenditure for the multi-level printed circuit board is very high as a result of the multiplicity of recesses and the fact that they can be each fitted with two ferrite core halves. In order to comply with the insulation distances specified according to the explosion protection standard, a minimum circuit board area and a plurality of metallization planes (layers) can be designed for the inductors. Furthermore, in order to achieve the specified inductance of the inductors, a multi-level printed circuit board having at least six metallization planes should be used, whereas four metallization planes suffice for the remaining wiring. Finally, the area of the inductors inside the multi-level printed circuit board limits the number of functional units which can be connected.

SUMMARY

An exemplary energy supply device for explosion-proof electronic functional units is disclosed, comprising: a plurality of inductors connected to supply an associated functional unit with a high-frequency AC voltage; at least one multi-level printed circuit board; and a distribution printed circuit board, wherein each inductor is formed as a substantially congruent conductor track of the at least one multi-level printed circuit board, the conductor tracks are connected to one another on the at least one multi-level printed circuit board, wherein the at least one multi-level printed circuit board is arranged vertically on a distribution printed circuit board, and wherein a number of metallization planes of the at least one multi-level printed circuit board is greater than a number of metallization planes of the distribution printed circuit board.

An exemplary energy supply device for explosion-proof electronic functional units is disclosed, comprising: an inductor connected to supply an associated functional unit with a high-frequency AC voltage; a multi-level printed circuit board; and a distribution printed circuit board, wherein the inductor is formed as substantially congruent conductor tracks of the multi-level printed circuit board, and the conductor tracks are connected to one another on the at least one multi-level printed circuit board, wherein the multi-level printed circuit board is arranged vertically on the distribution printed circuit board, and wherein a number of metallization planes of the multi-level printed circuit board is greater than a number of metallization planes of the distribution printed circuit board.

BRIEF DESCRIPTION OF THE DRAWINGS

For a full and more complete understanding of the claimed invention, reference is herein made to the following FIGURE:

FIG. 1 illustrates an energy supply device for explosion-proof electronic functional units according to an exemplary embodiment of the present disclosure.

DETAILED DESCRIPTION

Exemplary embodiments of the present disclosure specify an energy supply device for explosion-proof electronic functional units, which energy supply device supplies AC voltage and can supply a multiplicity of functional units with little effort.

Exemplary embodiments of the present disclosure are based on an energy supply device for explosion-proof electronic functional units, in which the functional units can be supplied from a high-frequency AC voltage which is individually output for each of the functional units via an inductor.

According to an exemplary embodiment described herein, the inductors can be formed as substantially congruent conductor tracks of a multi-level printed circuit board which can be connected to one another and can be arranged vertically on a distribution printed circuit board, the number of metallization planes of the multi-level printed circuit board being greater than the number of metallization planes of the distribution printed circuit board.

As a result of the vertical arrangement of the inductors on the distribution printed circuit board, their spacing on the distribution printed circuit board is much lower, with the result that a larger number of inductors is accommodated on the same area of the distribution printed circuit board. Accordingly, more functional units can be connected to the distribution printed circuit board given the same dimensions.

The distribution printed circuit board advantageously manages with a small number of metallization planes, with the result that the total expenditure for the distribution printed circuit board and associated inductors is lower than when the inductors can be accommodated in the distribution printed circuit board. In addition, the inductors can be in the form of separately testable units before installation.

As a result of the vertical arrangement of the inductors, it is technologically simple to permanently connect the inductors to one another by means of potting and therefore to meet the specified level of explosion protection.

FIG. 1 illustrates an energy supply device for explosion-proof electronic functional units according to an exemplary embodiment of the present disclosure. As shown in FIG. 1 the functional units can be supplied from a high-frequency AC voltage which is individually output for each of the functional units via an inductor 1. Specifically, a distribution printed circuit board 4 having a plurality of inductors 1 is provided, the inductors 1 being arranged vertically on the distribution printed circuit board 4.

The inductors 1 can be in the form of substantially congruent conductor tracks 2 of a multi-level printed circuit board 3 which can be connected to one another. In this case, each metallization plane of the multi-level printed circuit board 3 has at least one turn of the inductor 1. In order to form the specified number of turns, six metallization planes with conductor tracks 2 can be used, for example, in the embodiment shown.

The inductors 1 can be mechanically fastened with mechanical fasteners 5 and electrically contact-connected on the distribution printed circuit board 4. For this purpose, the distribution printed circuit board 4 has a plurality of levels of conductor tracks 2. However, the specified number for metallization planes of the distribution printed circuit board 4 is lower than in the multi-level printed circuit board 3. In order to form the specified conductor tracks 2, only four metallization planes with conductor tracks 2 can be used, for example, in the embodiment shown.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Inductor
2 Conductor track
3 Multi-level printed circuit board
4 Distribution printed circuit board

What is claimed is:

1. An energy supply device for explosion-proof electronic functional units, comprising:
   at least one inductor connected to supply an associated functional unit with a high-frequency AC voltage;
   at least one multi-level printed circuit board; and
   a distribution printed circuit board,
   wherein the at least one inductor is formed as a substantially congruent conductor track of the at least one multi-level printed circuit board, the conductor tracks are connected to one another on the at least one multi-level printed circuit board,
   wherein the at least one multi-level printed circuit board is arranged vertically on a distribution printed circuit board, and
   wherein a number of metallization planes of the at least one multi-level printed circuit board is greater than a number of metallization planes of the distribution printed circuit board.

2. The energy supply device of claim 1, wherein the at least one multi-level printed circuit board includes a plurality of multi-level printed circuit boards, and each multi-level printed circuit board includes the conductor track of one of the at least one inductor.

3. The energy supply device of claim 1, wherein each metallization plane of the at least one multi-level printed circuit board has at least one turn of the at least one inductor.

4. The energy supply device of claim 2, wherein each metallization plane of the plurality of multi-level printed circuit boards has at least one turn of the at least one inductor.

5. The energy supply device of claim 1, comprising:
   mechanical fasteners,
   wherein the at least one inductor is mechanically fastened to the distribution printed circuit board via the mechanical fasteners.

6. The energy supply device of claim 1, comprising:
   electrical contacts,
   wherein the at least one inductor is electrically connected to the distribution printed circuit board via the electrical contacts.

* * * * *